United States Patent

Chen et al.

(10) Patent No.: US 9,716,139 B2
(45) Date of Patent: Jul. 25, 2017

(54) METHOD FOR FORMING HIGH VOLTAGE TRANSISTOR

(71) Applicant: UNITED MICROELECTRONICS CORP., Hsin-Chu (TW)

(72) Inventors: Kuan-Chuan Chen, Taichung (TW); Chih-Chung Wang, Hsinchu (TW); Wen-Fang Lee, Hsinchu (TW); Nien-Chung Li, Hsinchu (TW); Shih-Yin Hsiao, Chiayi County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/727,875

(22) Filed: Jun. 2, 2015

(65) Prior Publication Data

US 2016/0358919 A1 Dec. 8, 2016

(51) Int. Cl.
*H01L 29/06* (2006.01)
*H01L 29/66* (2006.01)
*H01L 29/423* (2006.01)
*H01L 21/8234* (2006.01)
*H01L 27/088* (2006.01)

(52) U.S. Cl.
CPC .. *H01L 29/0653* (2013.01); *H01L 21/823418* (2013.01); *H01L 21/823462* (2013.01); *H01L 27/088* (2013.01); *H01L 29/4236* (2013.01); *H01L 29/66545* (2013.01)

(58) Field of Classification Search
CPC ........... H01L 27/0922; H01L 29/66545; H01L 21/823878; H01L 29/0653; H01L 29/4236; H01L 21/823842; H01L 21/82385
See application file for complete search history.

(56) References Cited

U.S. PATENT DOCUMENTS

| | | | |
|---|---|---|---|
| 5,342,796 A * | 8/1994 | Ahn | H01L 29/66613 257/E21.428 |
| 5,583,064 A * | 12/1996 | Lee | H01L 29/66613 257/332 |
| 6,114,194 A * | 9/2000 | Hsu | H01L 27/0266 257/E21.428 |
| 6,977,415 B2 * | 12/2005 | Matsuo | H01L 21/28114 257/330 |
| 7,157,339 B2 | 1/2007 | Lim | |

* cited by examiner

*Primary Examiner* — Kyoung Lee
(74) *Attorney, Agent, or Firm* — Winston Hsu

(57) ABSTRACT

A method for forming a high voltage transistor is provided. First, a substrate having a top surface is provided, following by forming a thermal oxide layer on the substrate. At least a part of the thermal oxidation layer is removed to form a recess in the substrate, wherein a bottom surface of the recess is lower than the top surface of the substrate. A gate oxide layer is formed in the recess, then a gate structure is formed on the gate oxide layer. The method further includes forming a source/drain region in the substrate.

18 Claims, 5 Drawing Sheets

METHOD FOR FORMING HIGH VOLTAGE TRANSISTOR

BACKGROUND OF THE INVENTION

1. Field of the Invention

The present invention relates to a method for forming a high voltage transistor, and more particularly, to a method for forming a high voltage transistor with a gate oxide layer embedded in the substrate.

2. Description of the Prior Art

Poly-silicon is conventionally used as a gate electrode in semiconductor devices, such as the metal-oxide-semiconductor (MOS). However, with a trend toward scaling down the size of semiconductor devices, the conventional poly-silicon gate has faced problems such as inferior performance due to boron penetration and unavoidable depletion effect which increases equivalent thickness of the gate dielectric layer, reduces gate capacitance, and worsens a driving force of the devices. Therefore, work function metals are used to replace the conventional poly-silicon gate to be the control electrode that are suitable for use as the high-K gate dielectric layer.

Conventional nonvolatile semiconductor memories, such as flash electrically erasable programmable read only memories (Flash EEPROMs), typically comprise a floating gate memory cell, which includes a source region, a drain region and a channel region formed in a semiconductor substrate, and a floating gate formed above the substrate between the channel region and a control gate. One method of programming or erasing a floating gate memory cell, utilizing a phenomenon known as Fowler-Nordheim tunneling, comprises applying a voltage differential, such as about 16 volts to about 23 volts, to the control gate while the channel region is kept at a low voltage, such as about 0 volts to about 2 volts, to force electrons into the floating gate. This movement of electrons is referred to as programming, and the high voltage applied to the control gate is known as program voltage. A similar method is employed to erase the memory cell by reversing the direction of bias to force the electrons out of the floating gate.

In order to attain an acceptable level of performance and reliability, it must exhibit high gated diode breakdown voltage characteristics to avoid junction breakdown, low leakage from drain to source, and a low body effect so that its threshold voltage is not excessively high. Conventional processing techniques require many separate photolithographic masking steps to manufacture this transistor and cannot be well combined into current "high-k metal gate replacement" process.

There exists a need for simplified methodology in manufacturing a high voltage, high performance transistor with fewer processing steps, thereby reducing, manufacturing costs and increasing production throughput.

SUMMARY OF THE INVENTION

The present invention therefore provides a method for forming a high voltage transistor so as to meet the above requirements.

According to one embodiment, a method for forming a high voltage transistor is provided. First, a substrate having a top surface is provided, following by forming a thermal oxide layer on the substrate. At least a part of the thermal oxidation layer is removed to form a recess in the substrate, wherein a bottom surface of the recess is lower than the top surface of the substrate. A gate oxide layer is formed in the recess, then a gate structure is formed on the gate oxide layer. The method further includes forming a source/drain region in the substrate.

The method set forth in the present invention is featured by using novel steps to form the high voltage transistor and the low voltage transistor, with simultaneously carrying out the metal gate replacement process. By using at least two thermal oxidation processes to form the thick first dielectric layer having only a small portion protruding over the substrate, the metal replacement process can be performed successfully.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
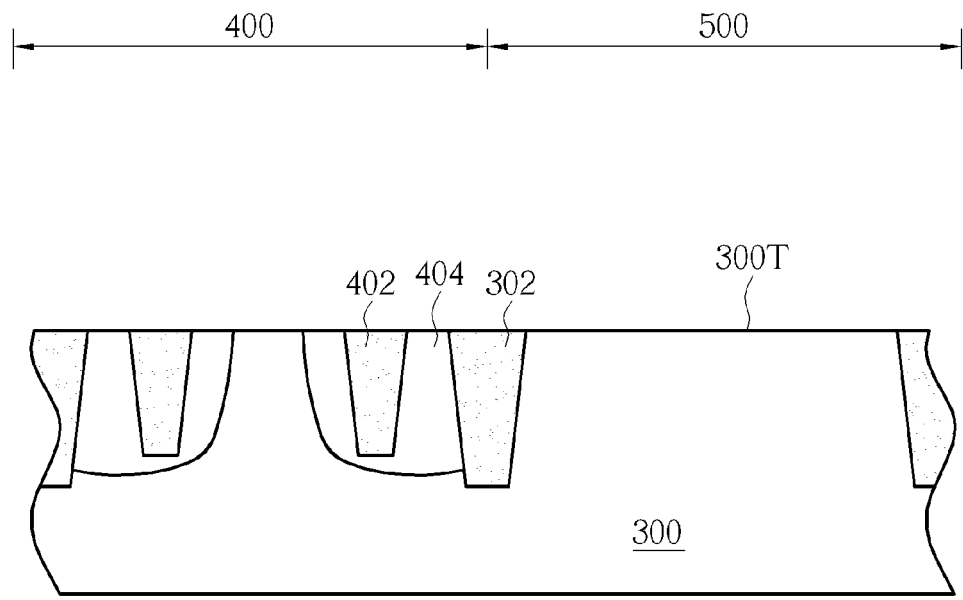
FIG. 1 to FIG. 8 show schematic diagrams of the method for forming a high voltage transistor according to one embodiment of the present invention.

Please refer to FIG. 1 to FIG. 8, showing schematic diagrams of the method for forming a high voltage transistor according to one embodiment of the present invention. Please refer to FIG. 1, a substrate 300 with a top surface 300T is provided to serve as a base for forming devices, components, or circuits. The substrate 300 is preferably composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layered materials thereof. The semiconductor substrate 300 may also be composed of other semiconductor materials, such as germanium, and compound semiconductor substrates, such as type III/V semiconductor substrates, e.g., GaAs. Although the semiconductor substrate 300 is depicted as a bulk semiconductor substrate, the arrangement of a semiconductor on an insulator substrate, such as silicon-on-insulator (SOI) substrates, are also suitable for the semiconductor substrate 300. A first region 400 and a second region 500 are defined on the substrate 300. In the subsequent steps, a high voltage transistor will be formed in the first region 400 and a low voltage transistor will be formed in the second region 500. A shallow trench isolation (STI) 302 is formed simultaneously or respectively in the first region 400 and the second region 500, encompassing and defining the active regions (not shown) where the high voltage transistor and the low voltage transistor will be formed. As shown in FIG. 1, after forming the STI 302, a doping region 404 is formed in the first region 400. The doping region 404 is formed by implanting appropriate concentration or type of dopant for the high voltage transistor to be formed. Optionally, an isolation structure 402 is formed, preferably completely embedded in the doping region 404. In detail, a depth of the isolation structure 402 is less than a depth of the doping region 404. In another embodiment, the forming sequence of the STI 302, the isolation structure 402 and the doping region 404 can be adjusted arbitrarily, depending on the requirements of the designs.

Figure 2:
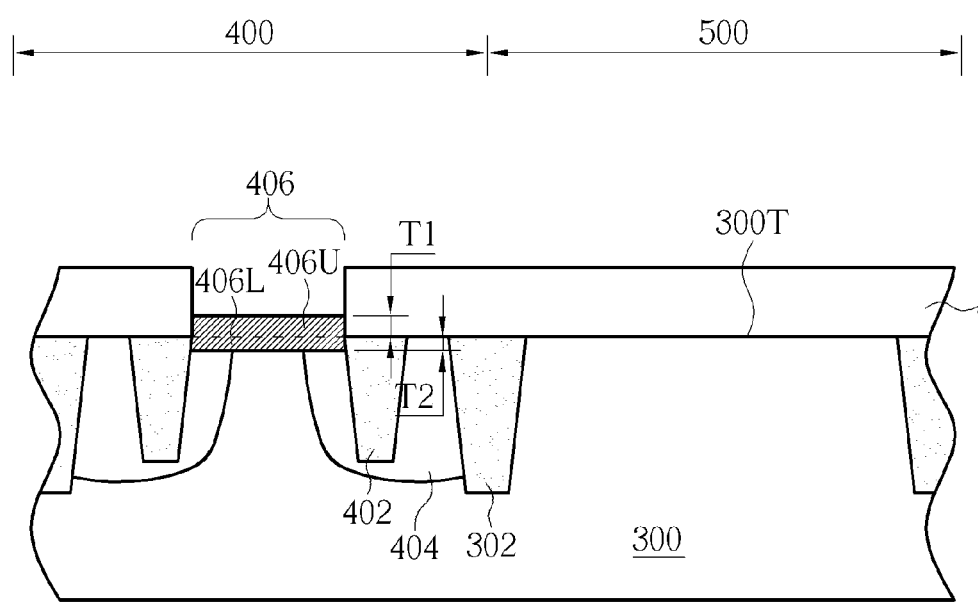

Next, as shown in FIG. 2, a thermal oxide layer 406 is formed between the two isolation structures 402 in the first region 400. Preferably, the thermal oxide layer 406 is not formed above the isolation structures 402, and two ends of the thermal oxide layer 406 are aligned with each sidewall of the two isolation structures 402. Alternatively, the ends of the thermal oxide layer 406 can be located between the isolation structure 402 and the doping region 404, depending on different designs. In the present invention, the thermal oxide layer 406 is formed by a first thermal oxidation process. The method for forming the thermal oxide layer 406 includes the following steps for example. First, a patterned mask layer 308 is formed on the substrate 300 both in the first region 400 and the second region 500, exposing the area between the two isolations structures 402 in the first region 400. The patterned mask layer 308 can include silicon nitride (SiN), silicon carbide (SiC) or silicon oxynitride (SiON) for example. A first thermal oxidization process is then carried out to form the thermal oxide layer 406 upon the exposed substrate 300. Since a portion of the exposed substrate 300 is consumed during the thermal oxidation process, the thermal oxide layer 406 would comprise a lower portion 406L which is embedded in the substrate 300 and lower than a top surface 300T of the substrate 300, and an upper portion 406U which is above the top surface 300T of the substrate 300. A thickness ratio between the upper portion 406U and the lower portion 406L is about 1.5 to 1. For instance, the thermal oxide layer 406 has a thickness substantially between 500 angstroms and 1200 angstroms, the upper portion 406U has a first thickness $T_1$ substantially between 250 angstroms and 995 angstroms, and the lower portion 406L has a second thickness $T_2$ substantially between 225 angstroms and 540 angstroms.

Figure 3:
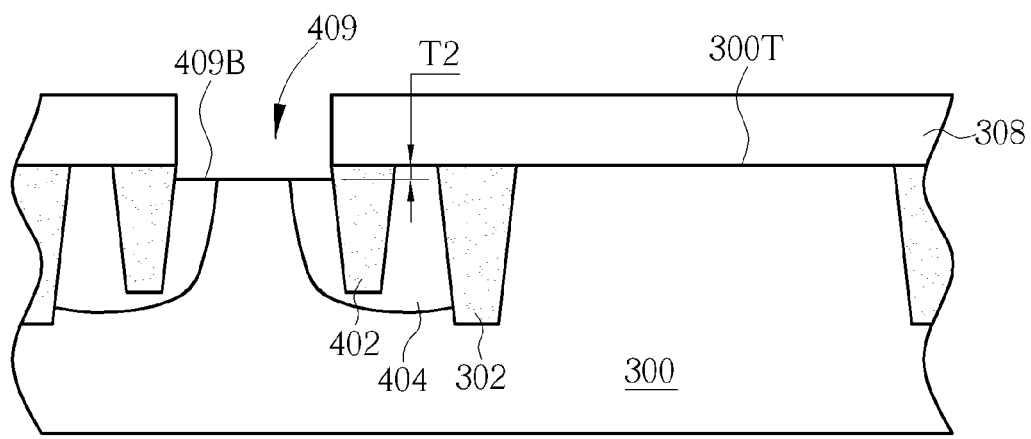

As shown in FIG. 3, a cleaning process is carried out to remove at least a portion of the thermal oxide layer 406. In the present embodiment, all the thermal oxide layer 406 is removed, and a recess 409 is thus formed in the substrate 300. The bottom surface 409B of the recess 409 is lower than the top surface 300T of the substrate 300. In one embodiment, the recess 409 has a depth substantially equal to the second thickness $T_2$ of the lower portion 406L. In one embodiment, the cleaning process is a wet etching process, such as a buffer oxide etching (BOE) which includes using hydrogen fluoride (HF) as an etchant, thereto remove the thermal oxide layer 406 without leaving unwanted residue. In another embodiment, an etching process can be optionally performed to adjust the depth of the recess 409.

Figure 4:
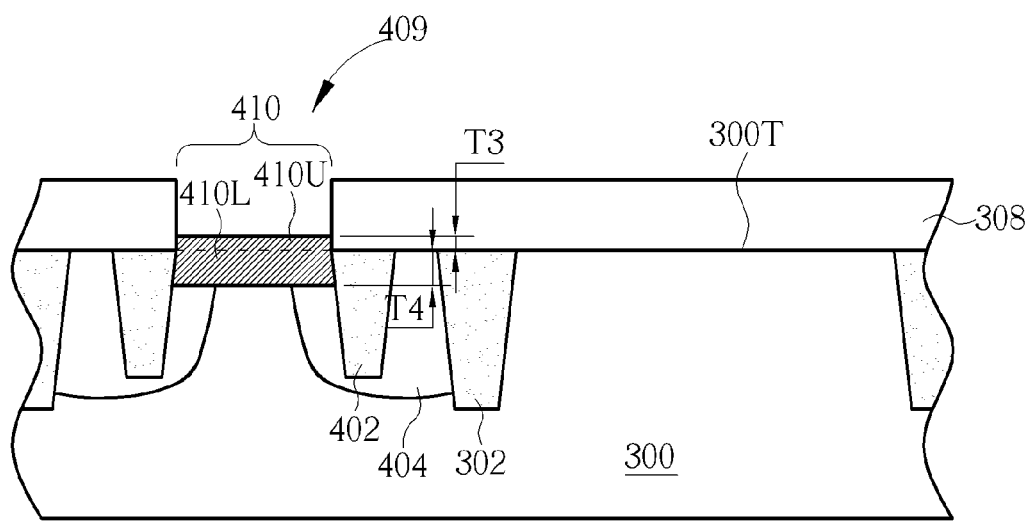

As shown in FIG. 4, a first dielectric layer 410 is formed in the recess 409. Preferably, the first dielectric layer 410 is also formed by a second thermal oxidization process. For the same situation in the first thermal oxidization process, a bottom surface 409B of the recess 409 is consumed and a portion of the first dielectric layer 410 would be located under the bottom surface 409B of the recess 409 and the other portion would be located thereabove. The thickness ratio of the two portions would be about 1.5 to 1, making a small part of the first dielectric layer 410 protruding over or level with the substrate 300. As shown in FIG. 4, the first dielectric layer 410 comprises an upper portion 410U above the top surface 300T of the substrate 300, and a lower portion 410L embedded in the substrate 300. Preferably, the thickness of the first dielectric layer 410 is substantially the same as that of the thermal oxide layer 406, which is between 500 angstroms and 1200 angstroms. In one embodiment, the upper portion 410U has a third thickness $T_3$ substantially between 25 angstroms and 375 angstroms, and the lower portion 410L has a fourth thickness $T_4$ substantially between 475 angstroms and 1140 angstroms.

Figure 5:
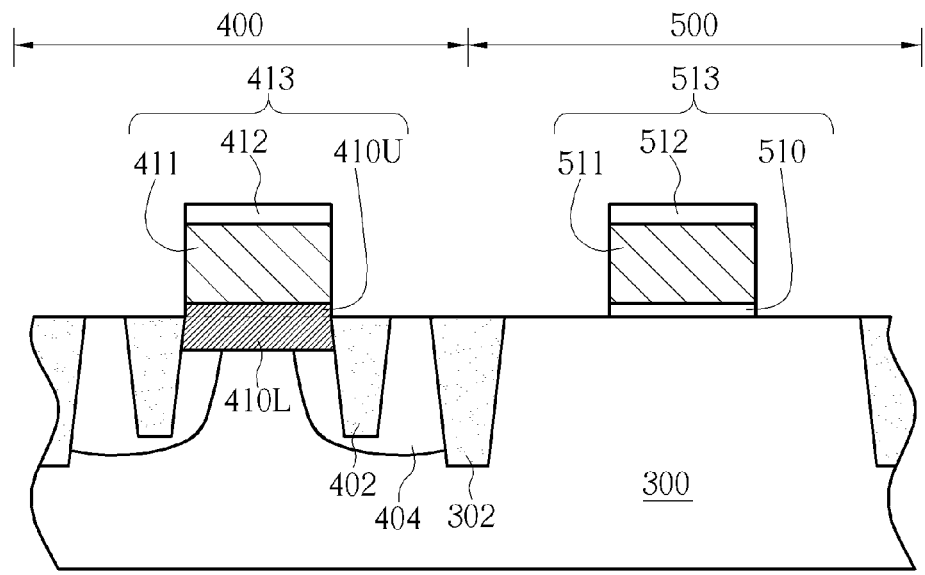

As shown in FIG. 5, after forming the first dielectric layer 410 in the first region 400, the patterned mask layer 308 is removed. A first patterned conductive layer 411 and a first patterned capping layer 412 are formed on the first dielectric layer 412. The upper portion 410U, the first patterned conductive layer 411 and the first patterned capping layer 412 together form a first gate stack 413. In the second region 500, a second patterned dielectric layer 510, a second patterned conductive layer 511 and a second patterned capping layer 512 are sequentially formed on the substrate 300, forming a second gate stack 513. Preferably, a thickness of the second patterned dielectric layer 510 is substantially equal to the third thickness $T_3$ of the upper portion 410U of the first dielectric layer 408, such that the top surfaces of the first gate stack 413 is about level with the top surface of the second gate stack 513.

In one embodiment, some or all of the components in the first gate stack 413 can be formed simultaneously with those of the second gate stack 513. For example, after forming the first dielectric layer 410 as shown in FIG. 4, another thermal oxidation process or deposition process can be formed to form a dielectric layer (not shown in FIG. 5) only in the second region 500 or both in the first region 400 and the second region 500. Subsequently, a conductive material layer (not shown) such as poly-silicon and a capping material layer (not shown) are formed comprehensively on the substrate 300. An etching process is carried out to simultaneously patterning the capping material layer (not shown), the conductive material layer (not shown) and the oxide layer (not shown) so as to form the structures as shown in FIG. 5. As such, the sidewalls of the first gate stack 413 are vertically aligned, and so do the second gate stack 513.

In another embodiment, the etching process would not pattern the first dielectric layer 410 so the sidewalls of the first patterned conductive layer 411 and the first patterned capping layer 412 are not aligned with the sidewalls of the upper portion 410U of the first dielectric layer 410. In this situation, the widths of the first patterned conductive layer 411 and the first patterned capping layer 412 can be greater or smaller than that of the first dielectric layer 408. When the first patterned conductive layer 411 has a larger width, it is preferably landing on the isolation structure 402. When in the embodiment that one end of the first dielectric layer 410 is located on the doping region 404, it is noted that the first patterned conductive layer should not contact the doping region 404. When the first patterned conductive layer 411 has a smaller width than the total first dielectric layer 410, the upper portion 410U of the first dielectric layer 410 can be patterned, thereby forming a ladder structure (not shown) in the sidewall of the first dielectric layer 410. It is noted that the former embodiment shows that the layers in the first region 400 and the second region 500 can be formed simultaneously. However, they can be formed separately. For example, the dielectric layer 510 can be formed by a chemical vapor deposition (CVD) process and the material thereof can be made of high-k dielectric material. The high-k material may include rare earth metal oxide or lanthanide oxide, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide (ZrO$_2$), zirconium silicon oxide (ZrSiO$_4$), hafnium zirconium oxide (HfZrO), yttrium oxide (Yb$_2$O$_3$), yttrium silicon oxide (YbSiO), zirconium aluminate (ZrAlO), hafnium aluminate (HfAlO), aluminum nitride (AlN), titanium oxide (TiO$_2$), zirconium oxynitride (ZrON), hafnium oxynitride (HfON), zirconium silicon oxynitride (ZrSiON), hafnium silicon oxynitride (HfSiON), strontium bismuth tantalite (SrBi$_2$Ta$_2$O$_9$, SBT), lead zirconate titanate (PbZr$_x$Ti$_{1-x}$O$_3$, PZT) or barium strontium titanate (Ba$_x$Sr$_{1-x}$TiO$_3$, BST), but is not limited thereto.

Figure 6:
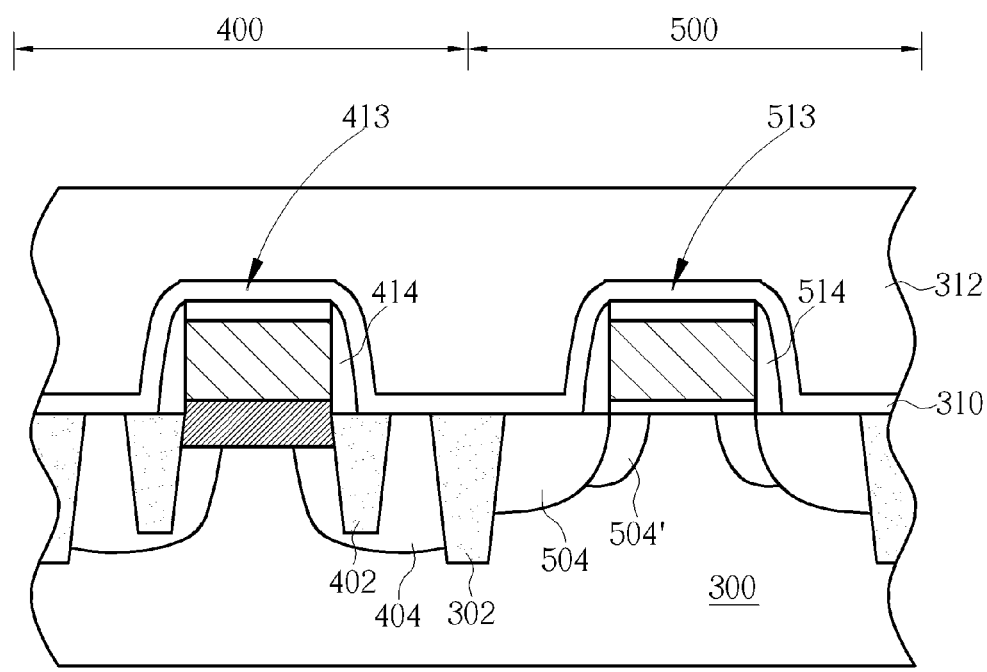

Next, as shown in FIG. 6, a first spacer 414 is formed on the sidewall of the first gate stack 413 in the first region 400 and a second spacer 514 is formed on the sidewall of the second gate stack 513 in the second region 500. The first spacer 414 and the second spacer 514 can be a multi-layered structure including high temperature oxide (HTO), SiN, SiO or SiN formed by hexachlorodisilane (Si$_2$Cl$_6$) (HCD-SiN). A source/drain region 504 and an optional light doped drain (LDD) region 504' can be formed in the substrate 300 in the second region 500. The doping region 404 can serve as the source/drain region for the high voltage transistor to be formed. In another embodiment, additional doping region can be formed in the substrate 300 in the first region 400 to adjust the electrical performance of the high voltage transistor. Thereafter, a contact etch stop layer (CESL) 310 and an inter-layer dielectric (ILD) layer 312 are formed on the substrate 300.

Figure 7:
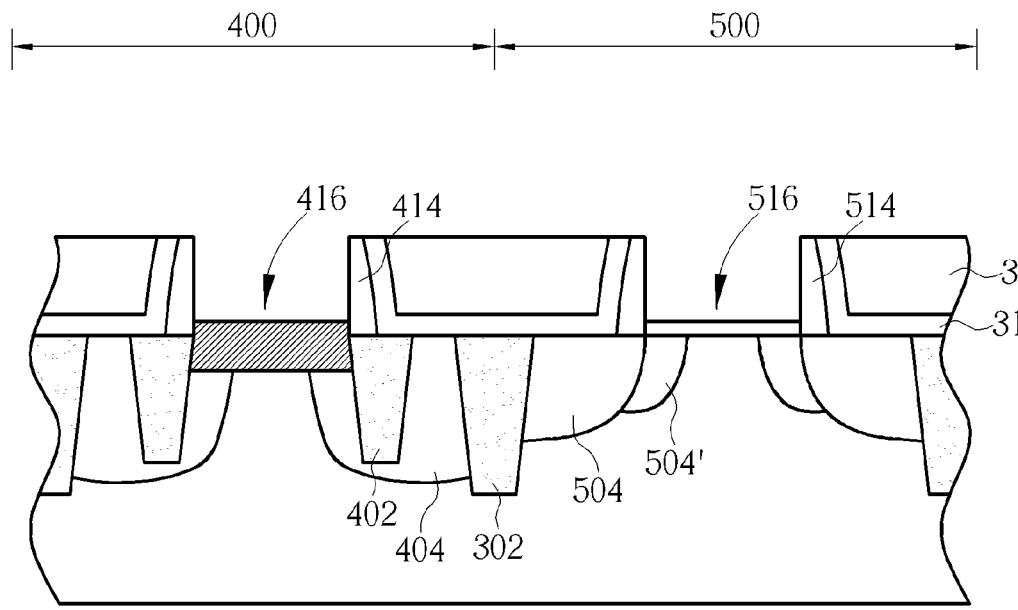

As shown in FIG. 7, a planarization process, such as a chemical mechanical polish (CMP) process or an etching-back process or their combination is performed to remove a part of the ILD layer 312, a part of the CESL 310, a part of the first spacer 414, a part of the second spacer 514, and completely remove the first patterned capping layer 412 and the second patterned capping layer 512, until the top surface of the first patterned conductive layer 411 and the second patterned conductive layer 511 are exposed. Next, an etching process is performed to remove the first patterned conductive layer 411 and the second patterned conductive layer 511, thereby forming a first trench 416 in the first region 400 and a second trench 516 in the second region. 500.

Figure 8:
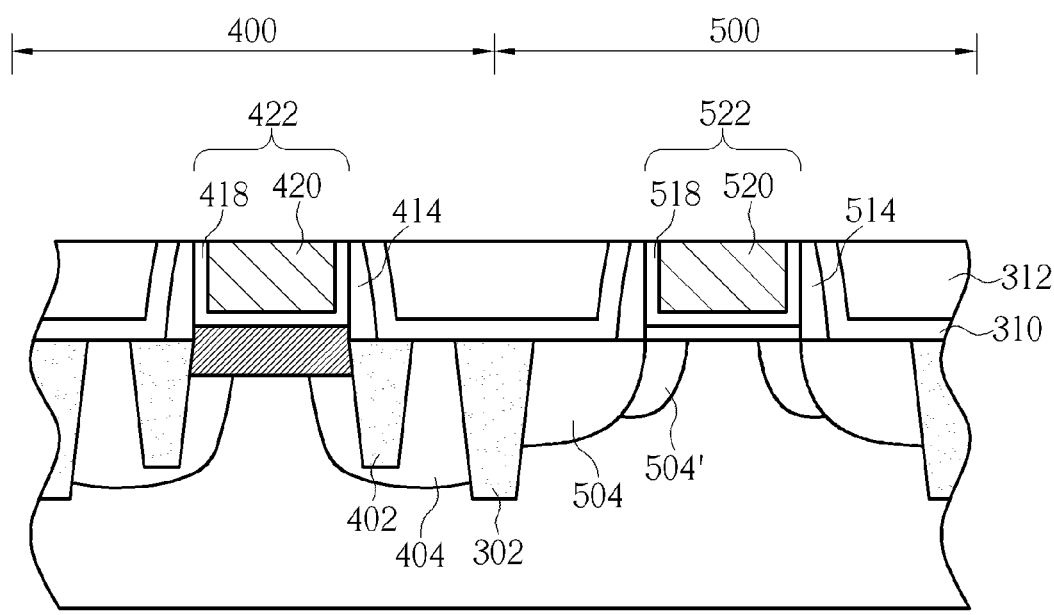

As shown in FIG. 8, a first metal gate 422 in formed in the first trench 416 and a second metal gate 522 is formed in the second trench 522. The first metal gate 422 can include a plurality of metal layers, such as a first work function metal layer 418 and a first low resistance metal layer 420. The second metal gate 522 can include a plurality of metal layers, such as a second work function metal layer 518 and a second low resistance metal layer 520. The components of the first metal gate 422 and the second metal gate 522 can be formed simultaneously or separately. The method for forming the first metal gate 422 and the second metal gate 522 may include a plurality of deposition processes to fill metal layers into the first trench 416 and the second trench 516, and a planarization process to remove the metal layers outside the first trench 416 and the second trench 516. In one embodiment, the first work function metal layer 418 or the second work function metal layer 518 is used to tune the work function of the first metal gate 422 or the second metal gate 522. In one embodiment, the first work function metal layer 418 or the second work function metal layer 518 comprises P type work function metal, such as Ni, Pd, Pt, Be, Ir, Te, Re, Ru, Rh, W, Mo, or WN, RuN, MoN, TiN, TaN, or WC, TaC, TiC, or TiAlN, TaAlN, but should not be limited thereto. In another embodiment, the first work function metal layer 418 or the second work function metal layer 518 comprises N type work function metal, such as TiAl, ZrAl, WAl, TaAl or HfAl, but should not be limited thereto. The first low resistance metal layer 420 and the second low resistance metal layer 520 comprises includes Al, Ti, Ta, W, Nb, Mo, TiN, TiC, TaN, Ti/W or Ti/TiN, and is not limited thereto. It is understood that there may be other metal layers for different functions in the first metal gate 422 or the second metal gate 522, such as a barrier layer including TiN, TaN, Ti/TiN or Ta/TaN.

By doing this, a high voltage transistor 424 is therefore formed in the first region 400, having a thicker first dielectric layer 410 as the gate dielectric layer. A low voltage transistor 524 is therefore formed in the second region 500, having a thinner second dielectric layer 510 as the gate dielectric layer. In one embodiment, the threshold voltage of the high voltage transistor 424 is about 20V to 30V, and the threshold voltage of the low voltage transistor 524 is about 2V and 3V.

From the above description, it is one salient feature in the present invention that uses at least two thermal oxidation processes to form the thick first dielectric layer 410 having only a small portion (upper portion 410U) protruding over the substrate 300. There would be no great height difference between the first gate stack 413 and the second gate stack 513. Accordingly, the subsequent metal gate replacement process shown in FIG. 7 and FIG. 8 can be carried out without removing needed material.

Figure 9:
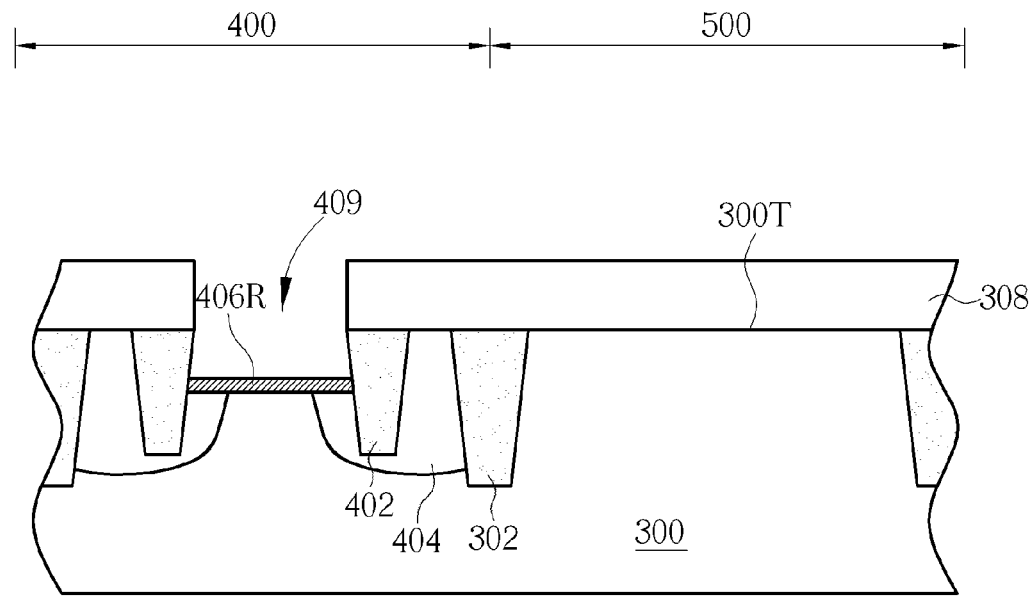
FIG. 9 and FIG. 10 show schematic diagrams of the method for forming a high voltage transistor according to another embodiment of the present invention.
Figure 10:
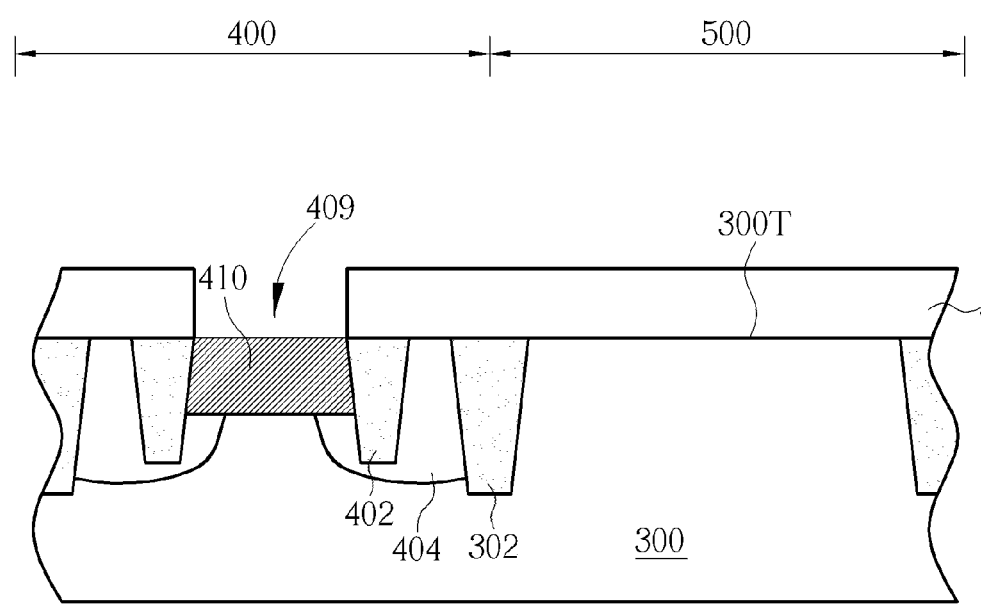

Please refer to FIG. 9 and FIG. 10, which show schematic diagrams of the method for forming a high voltage transistor according to another embodiment of the present invention. The steps in this embodiment are similar to those of the former embodiment in FIG. 1 to FIG. 2, and detail descriptions thereof are omitted. After forming the thermal oxide layer 406 as shown in FIG. 2, please see FIG. 8. A cleaning process is performed to remove a part of the thermal oxide layer 406 while the other part of the thermal oxide layer 406R is still remained in the recess 409. Preferably, the top surface of the remained thermal oxide layer 406R is lower than the top surface 300T of the substrate 300. Next, as shown in FIG. 10, after carrying out the second thermal oxidation process, the first dielectric layer 410 is formed in the recess 409. Since there is remained thermal oxide layer 406R, only a small part of the substrate 300 can be oxidized to form the first dielectric layer 410. In this embodiment, the top surface of the first dielectric layer 410 is leveled with the top surface 300T of the substrate 300 so no upper portion would protrude over the substrate 300. In another embodiment, the top surface of the first dielectric layer 410 can be lower than the top surface 300T of the substrate 300.

In light of above, the present invention provides a method of forming a high voltage transistor which is featured by using novel steps to form the high voltage transistor and the low voltage transistor, with simultaneously carrying out the metal gate replacement process. By using at least two thermal oxidation processes to form the thick first dielectric layer having only a small portion protruding over the substrate, the metal replacement process can be performed successfully.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method for forming a high voltage transistor, comprising:
providing a substrate having a top surface;
forming a thermal oxide layer on the substrate;
removing a least a part of the thermal oxide layer to form a recess in the substrate, wherein a bottom surface of the recess is lower than the top surface of the substrate;
forming a gate oxide layer in the recess;
forming a gate structure on the gate oxide layer; and forming a source/drain region in the substrate, wherein before forming the thermal oxide layer, further comprises forming an isolation structure in the substrate, wherein the isolation structure is embedded in the source/drain region.

2. The method for forming a high voltage transistor according to claim 1, wherein a topmost surface of the thermal oxide layer comprises $SiO_2$.

3. The method for forming a high voltage transistor according to claim 1, wherein the thermal oxide layer has a thickness substantially between 500 angstroms and 1200 angstroms.

4. The method for forming a high voltage transistor according to claim 1, wherein before forming the recess, a lower portion of the thermal oxide layer is embedded in the substrate.

5. The method for forming a high voltage transistor according to claim 4, wherein the lower portion of the thermal oxide layer has a thickness substantially between 225 angstroms and 540 angstroms.

6. The method for forming a high voltage transistor according to claim 4, wherein the recess has a depth substantially equal to the thickness of the lower portion of the thermal oxide layer.

7. The method for forming a high voltage transistor according to claim 1, wherein the thermal oxide layer is removed by a wet etching process.

8. The method for forming a high voltage transistor according to claim 1, wherein the thermal oxide layer is completely removed from the substrate.

9. The method for forming a high voltage transistor according to claim 1, wherein after forming the recess, a part of the thermal oxide layer is remained.

10. The method for forming a high voltage transistor according to claim 1, wherein the gate oxide layer is formed by a thermal oxidation process.

11. The method for forming a high voltage transistor according to claim 10, wherein a bottom surface of the recess is oxidized to form the gate oxide layer.

12. The method for forming a high voltage transistor according to claim 1, wherein the gate oxide layer has a thickness substantially between 500 angstroms and 1200 angstroms.

13. The method for forming a high voltage transistor according to claim 1, wherein a lower portion of the gate oxide layer is embedded in the substrate.

14. The method for forming a high voltage transistor according to claim 13, wherein the lower portion of the gate oxide layer has a thickness substantially between 475 angstroms and 1140 angstroms.

15. The method for forming a high voltage transistor according to claim 1, wherein a topmost surface of the gate oxide layer is level with the top surface of the substrate.

16. The method for forming a high voltage transistor according to claim 1, wherein the gate structure comprises a dummy gate.

17. A method for forming a high voltage transistor, comprising:
   providing a substrate having a top surface;
   forming a thermal oxide layer on the substrate;
   removing a least a part of the thermal oxide layer to form a recess in the substrate, wherein a bottom surface of the recess is lower than the top surface of the substrate;
   forming a gate oxide layer in the recess;
   forming a gate structure on the gate oxide layer;
   forming a source/drain region in the substrate; and
   forming a low voltage transistor on the substrate.

18. The method for forming a high voltage transistor according to claim 17, further comprises performing a metal gate replacement process to remove the dummy gate of the high voltage transistor and a dummy gate of the low voltage transistor.

* * * * *